(12) United States Patent
Jeung et al.

(10) Patent No.: US 6,747,348 B2
(45) Date of Patent: Jun. 8, 2004

(54) APPARATUS AND METHOD FOR LEADLESS PACKAGING OF SEMICONDUCTOR DEVICES

(75) Inventors: Boon Suan Jeung, Singapore (SG); Chia Yong Poo, Singapore (SG); Low Siu Waf, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/981,948

(22) Filed: Oct. 16, 2001

(65) Prior Publication Data

US 2003/0071335 A1 Apr. 17, 2003

(51) Int. Cl.[7] .............................................. H01L 23/02

(52) U.S. Cl. ...................................... 257/686; 257/777

(58) Field of Search ................................. 257/686, 777, 257/678, 666

(56) References Cited

U.S. PATENT DOCUMENTS

| | | | |
|---|---|---|---|
| 5,128,831 A | 7/1992 | Fox, III et al. | 361/396 |
| 5,252,857 A | 10/1993 | Kane et al. | 257/686 |
| 5,412,247 A * | 5/1995 | Martin | 257/678 |
| 5,518,957 A | 5/1996 | Kim | 437/182 |
| 5,714,800 A * | 2/1998 | Thompson | 257/686 |
| 5,841,193 A | 11/1998 | Eichelberger | 257/723 |
| 5,851,845 A | 12/1998 | Wood et al. | 438/15 |
| 5,883,426 A | 3/1999 | Tokuno et al. | 257/686 |
| 5,891,797 A | 4/1999 | Farrar | 438/619 |
| 5,933,713 A | 8/1999 | Farnworth | 438/127 |
| 5,946,553 A | 8/1999 | Wood et al. | 438/108 |
| 5,986,209 A | 11/1999 | Tandy | 174/52.4 |
| 5,990,566 A | 11/1999 | Farnworth et al. | 257/783 |
| 6,004,867 A | 12/1999 | Kim et al. | 438/459 |
| 6,008,070 A | 12/1999 | Farnworth | 438/114 |
| 6,020,624 A | 2/2000 | Wood et al. | 257/618 |
| 6,020,629 A | 2/2000 | Farnworth et al. | 257/686 |
| 6,025,640 A | 2/2000 | Yagi et al. | 257/666 |
| 6,028,365 A | 2/2000 | Akram et al. | 257/778 |
| 6,051,878 A | 4/2000 | Akram et al. | 257/686 |
| 6,072,233 A | 6/2000 | Corisis et al. | 257/686 |
| 6,072,236 A | 6/2000 | Akram et al. | 257/698 |
| 6,124,634 A | 9/2000 | Akram et al. | 257/698 |
| 6,153,924 A | 11/2000 | Kinsman | 257/666 |

(List continued on next page.)

OTHER PUBLICATIONS

U.S. patent application Ser. No. 10/033,340, filed Dec. 2001.
Zwenger, Curtis, et al., "*Technologies and Trends in Wafer Level Packaging*", Enabling a Microelectronic World, Amkor Technology, Inc., 2001.
"Low Cost Area Array Package Fully Integrated Printed Circuit, Chip Interconnect and Assembly", EPIC Chip Scale Package Technology, EPIC Technologies, Inc.
Lau, John H and Shi Wei Ricky Lee, *Chip Scale Package (CSP), Design, Materials. Processes Reliabilty, and Applications* , pp. 355, 487–488, McGraw–Hill, New York, 1999.

*Primary Examiner*—Phat X. Cao
(74) *Attorney, Agent, or Firm*—Dorsey & Whitney LLP

(57) ABSTRACT

The present invention is directed to a leadless and interconnected semiconductor package. The package includes a first chip having bond pads with a second chip having bond pads positioned on the first chip to form a vertically stacked package. Interconnections between the bond pads are formed by metallized layers on the package that extend to an edge of the package to join castellations along sides of the package to form a plurality of leadless input/output locations for the package. In one embodiment, the castellations include planar metallized portions. In another embodiment, the castellations include semi-cylindrical metallized portions. In still another embodiment, insulators are positioned between the chips, and on the package base. In still another embodiment, a chip includes a photosensitive device having screening optical layers. Bond pads on the chip are electrically coupled to castellations extending from the bond pads to form leadless input/output locations for the package.

43 Claims, 12 Drawing Sheets

U.S. PATENT DOCUMENTS

| | | | |
|---|---|---|---|
| 6,175,149 B1 | 1/2001 | Akram | 257/676 |
| 6,184,465 B1 | 2/2001 | Corisis | 174/52.4 |
| 6,187,615 B1 | 2/2001 | Kim et al. | 438/113 |
| 6,211,572 B1 * | 4/2001 | Fjelstad et al. | 257/781 |
| 6,212,767 B1 | 4/2001 | Tandy | 29/836 |
| 6,225,689 B1 | 5/2001 | Moden et al. | 257/686 |
| 6,228,548 B1 | 5/2001 | King et al. | 430/106 |
| 6,228,687 B1 | 5/2001 | Akram et al. | 438/125 |
| 6,235,552 B1 | 5/2001 | Kwon et al. | 438/106 |
| 6,235,554 B1 | 5/2001 | Akram et al. | 438/109 |
| 6,258,623 B1 | 7/2001 | Moden et al. | 438/106 |
| 6,261,865 B1 | 7/2001 | Akram | 438/111 |
| 6,281,577 B1 | 8/2001 | Oppermann et al. | 257/724 |
| 6,294,839 B1 | 9/2001 | Mess et al. | 257/777 |
| 6,297,547 B1 | 10/2001 | Akram | 257/676 |
| 6,303,981 B1 | 10/2001 | Moden | 357/666 |
| 6,320,250 B1 * | 11/2001 | Takahashi | 257/686 |
| 6,326,697 B1 | 12/2001 | Farnworth | 257/779 |
| 6,326,698 B1 | 12/2001 | Akram | 257/781 |
| 6,407,381 B1 | 6/2002 | Glenn et al. | 250/239 |
| 6,503,780 B1 | 1/2003 | Glenn et al. | 438/116 |

\* cited by examiner

APPARATUS AND METHOD FOR LEADLESS PACKAGING OF SEMICONDUCTOR DEVICES

TECHNICAL FIELD

This invention relates generally to integrated circuit packaging. More particularly, the invention relates to interconnected and leadless packaging of semiconductor devices.

BACKGROUND OF THE INVENTION

Integrated circuits may be contained in a variety of different packages before they are integrated into portions of larger electronic systems. The packages are generally comprised of one or more semiconductor chips encapsulated in a packaging material. In the case of packages containing several chips, the chips are interconnected to permit the chips to cooperatively perform a variety of tasks. In addition to the interconnections between the chips within the package, other connections generally extend from the package to permit the integrated circuit to interact with other portions of a larger electronic system. The individual chips may be arranged in the package in a planar configuration with electrical interconnections extending between the chips, but increasingly, the individual chips are arranged in a vertical stack, with the interconnections extending between the chips comprising the stack. A stacked wafer-level package has numerous advantages over the planar arrangement, including reduced interconnection lengths, faster processing times, and substantial reductions in the size and weight of the package.

FIG. 1 is a partial cross sectional view showing a vertically stacked semiconductor package 10 according to the prior art. The package 10 generally includes a substrate 16 that supports a first semiconductor chip 14, which is retained on the substrate 16 by an adhesive layer 18. The adhesive layer 18 is generally comprised of an adhesive compound having a high dielectric strength to prevent electrical communication between the chip 14 and the substrate 16. The chip 14 also generally includes one or more bond pads 15 that are electrically coupled to the circuits formed on the chip 14, which form at least a portion of the signal input and/or signal output locations for the chip 14. A second chip 12 is positioned on the chip 14, and is similarly retained on the chip 14 by an adhesive layer 19. The second chip 12 also includes one or more bond pads 11 that are coupled to the circuits formed on the chip 12, and similarly form at least a portion of the signal input and/or signal output locations for the chip 12. Electrical communication between the chip 12 and the chip 14 is obtained through one or more electrically conductive bonding wires 13 that couple the bond pad 11 on the chip 12 to the bond pad 15 on the chip 14. The bonding wires 13 are generally comprised of gold or aluminum, and may be attached to the bond pads 11 and 15 by spot welding, soldering, or by various conductive adhesive compounds. The bonding wires 13 then generally proceed away from the package 10 to provide an electrical connection to other portions of a larger electronic system (not shown).

The prior art semiconductor package 10 shown in FIG. 1 has numerous drawbacks, however. For example, the bonding wire 13 generally has a relatively long physical length in order to establish the required electrical interconnections between the bond pads 11 and 15. The long physical length of bonding wire 13 may therefore lead to increased signal propagation delays between the chips 12 and 14. Moreover, as the length of the bonding wire 13 increases, undesirable effects stemming from parasitic capacitance and/or inductance introduced by the bonding wire 13 also increase. Other shortcomings associated with the package 10 may include the reflection of at least part of the signal transmitted along the bonding wire 13 resulting from impedance discontinuities along the bonding wire 13, or at the connection interface between the bonding wire 13 and the bond pads 11 and 15. Still further, as the length of the bonding wire 13 increases, the bonding wire 13 becomes increasingly susceptible to electromagnetic interference since the bonding wire 13 may act as an antenna. Still other drawbacks are present in prior art package 10. For instance, the size of the bond pads 11 and 15 formed on the chips 12 and 14 must generally be relatively large to accommodate the connections formed with the bonding wire 13, which generally limits either the number of input and output locations, or the number of circuits that may be formed on the chips 12 and 14. Moreover, since the bond pads 11 and 15 are generally comprised of gold, the relatively large bond pad areas require additional amounts of this material, which increases the cost of each unit.

Other prior art packaging methods mitigate some of the drawbacks associated with the use of bonding wire interconnections, as described above, but introduce still other drawbacks. For example, tape automated bonding (TAB) methods may be used to establish the interconnections between vertically stacked semiconductor chips. In TAB, metallic interconnection traces are formed on a multi-layer polymer tape (not shown). The polymer tape is positioned adjacent to the chips 12 and 14 with traces and bonding locations pre-formed on the tape that correspond to the bond pads 11 on the chip 12, and the bond pads 15 on the chip 14. The bonding locations on the tape are then attached to the bond pads 11 and 15 on the chips 12 and 14 using conventional joining techniques such as reflow soldering or conductive adhesives. Although TAB allows the bond pads 11 and 15 on the chips 12 and 14 to be spaced at closer intervals than is generally achievable using the foregoing bonding wire method, each chip must generally have its own tape that is individually patterned to conform to the bonding pad arrangements on the chips that are to be interconnected. Consequently, the time and cost associated with the design and fabrication of bonding tapes that are individually configured for each bonding requirement renders TAB methods suitable only to applications where large production quantities of semiconductor packages are anticipated.

The "flip-chip" method represents still another prior art semiconductor packaging method, which permits the bond pads on adjacent chips to be connected without the use of a discrete interconnecting elements, as employed in the foregoing bonding wire method, or in TAB. In the "flip chip" method, the contact pads of a chip are generally wetted with a reflowable material, such as a solder alloy. The chip is then brought into facial contact with an adjacent chip or substrate that has a corresponding set of bond pads. Reflowing the solder alloy in a furnace then electrically and mechanically joins the chips. Although the foregoing method eliminates many of the drawbacks associated with the wire bonding and TAB interconnection methods, other drawbacks are introduced. For example, the chips thus joined may exhibit significantly different rates of thermal expansion, which may lead to bonding failure between the chips. This shortcoming may be further exacerbated by the degradation of heat conduction through the chip stack that is due to an increase in the thermal resistance between the chips. Additionally, since the connections are formed between the chips, a visual inspection of the bond integrity is generally not possible.

Accordingly, there is a pronounced need for an interconnection apparatus and method for semiconductor packages comprised of vertical chip stacks that permits relatively short interconnecting lengths to extend between chip bonding pads that are patterned on the chips at relatively high densities, while avoiding the thermal incompatibility difficulties present in prior art methods, which is easily adaptable to small as well as larger production runs of semiconductor packages.

SUMMARY OF THE INVENTION

The present invention is directed to a leadless and interconnected semiconductor package. The package includes a first semiconductor chip with a second semiconductor chip positioned on the first chip to form a vertically stacked package. Each semiconductor chip further includes a plurality of bond pads disposed on an active surface of the chips that are electrically coupled to the active elements formed within each chip. Interconnections between the bond pads on each chip are formed by metallized layers disposed on the package that extend between corresponding bond pads and join a plurality of castellations disposed along sides of the package to form a plurality of leadless input/output locations for the package. In one aspect of the invention, the castellations include generally planar metallized portions extending downwardly to a lower surface of the package. In another aspect, the castellations include semi-cylindrical metallized portions that project inwardly into sides of the package. In a further aspect, a dielectric insulator is positioned between the first and second chips and positioned on a base of the package. In still a further aspect, a semiconductor chip with a photosensitive device formed therein includes at least one optical layer positioned on the photosensitive device. A plurality of bond pads are positioned on the chip that are electrically coupled to the photosensitive device on the chip. Castellations extend outwardly from the bond pads to form a plurality of leadless input/output locations for the package.

DETAILED DESCRIPTION OF THE INVENTION

The present invention is generally directed to a method and apparatus for forming vertically stacked integrated circuit packages. More particularly, the invention relates to a chip interconnection and leadless packaging apparatus and method for semiconductor devices. Many of the specific details of certain embodiments of the invention are set forth in the following description and in FIGS. 2 through 13 to provide a thorough understanding of such embodiments. One skilled in the art will understand, however, that the present invention may be practiced without several of the details described in the following description.

Figure 1:
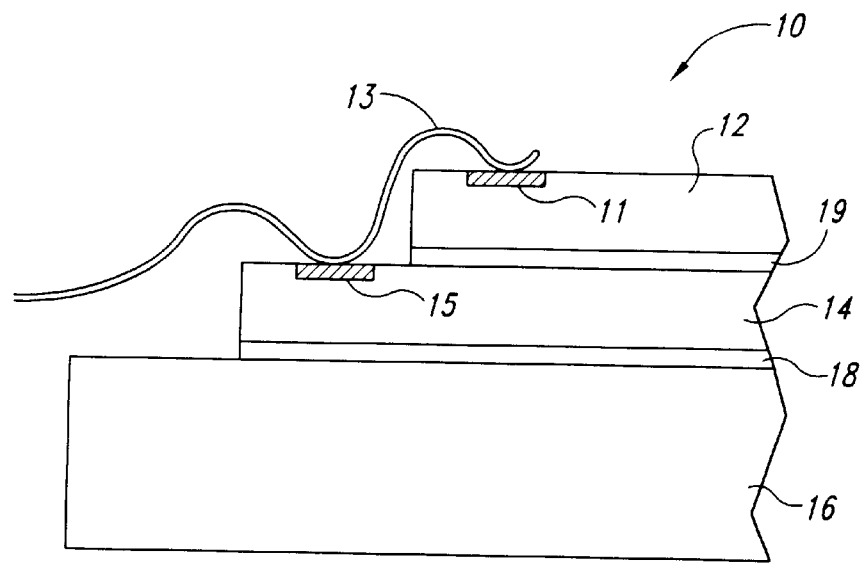
FIG. 1 is a partial cross sectional view of a vertically stacked semiconductor package according to the prior art.
Figure 2:
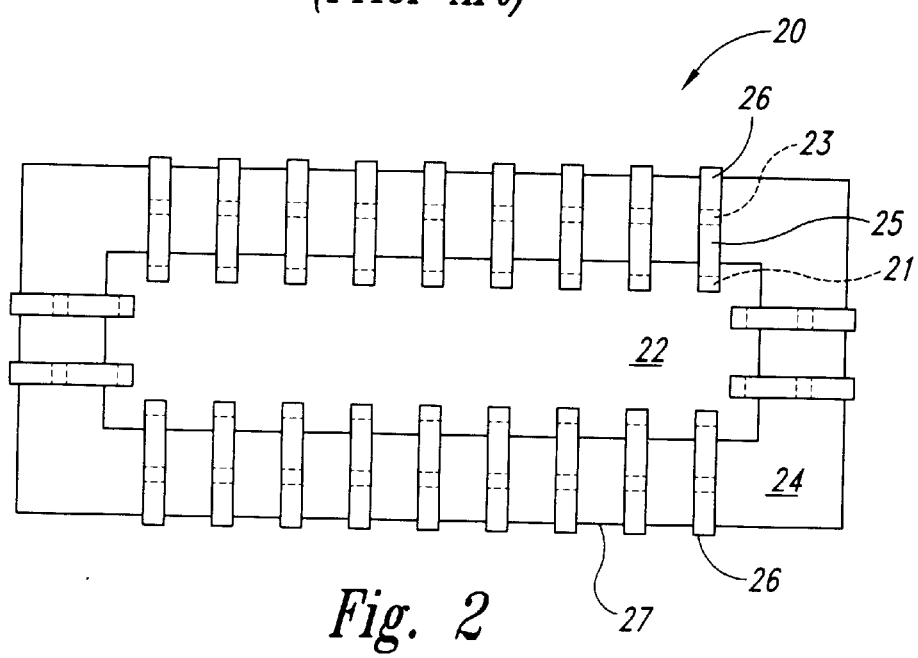
FIG. 2 is a plan view of a vertically stacked, leadless semiconductor package according to an embodiment of the invention.

FIG. 2 is a plan view of a vertically stacked, interconnected and leadless semiconductor package 20 according to an embodiment of the invention. A first chip 24 includes a plurality of active elements formed therein, which are electrically coupled to a plurality of bond pads 23 disposed on an active surface of the chip 24. The bond pads 23 are positioned on a peripheral region of the chip 24, and are structured to form an electrically conductive interface with other chips or devices. A second chip 22 similarly includes a plurality of active elements that are electrically coupled to a plurality of bond pads 21 disposed on an active surface of the chip 22. The bond pads 21 are positioned on a peripheral region of the chip 22, and are also structured to form electrically conductive interfaces with other chips or devices. The second chip 22 is positioned on the first chip 24 to form a vertically stacked arrangement, with electrical interconnections 25 extending between the bond pads 23 on the first chip 24 and the bond pads 21 on the second chip 22. The interconnections 25 generally extend from the bond pads 23 on the first chip 24 across the peripheral region of first chip 24 then downwardly along a side of the first chip 24 to electrically couple with the bond pads 21 on the second chip 22. The package 20 further includes a plurality of castellations 26 that are electrically coupled to the interconnections 25, which extend outwardly from the bond pads 23.

Figure 3:
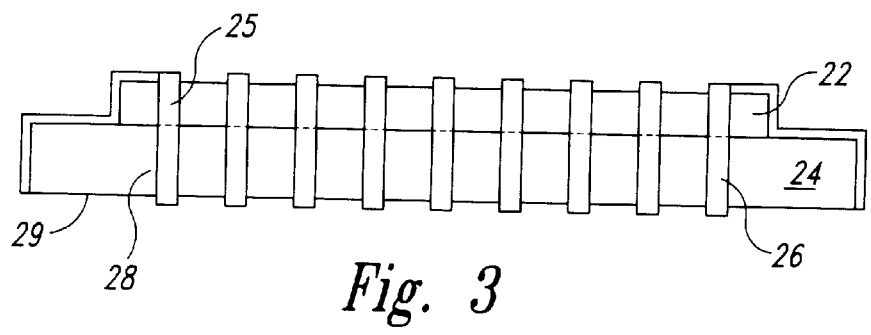
FIG. 3 is a side view of a vertically stacked, leadless semiconductor package according to an embodiment of the invention.

FIG. 3 is a side view of the semiconductor package 20, which shows the castellations 26 in greater detail. The castellations 26 are generally straight, planar conductive members that extend downwardly from the interconnections 25 along a side 28 of the chip 24 to a lower surface 29 of the package 20. The castellations 26 thus constitute a plurality of leadless input/output locations for the package 20 that permit electrical coupling of the package 20 to other external circuits or devices (not shown). The interconnections 25 and the castellations 26 may be comprised of various metals, including aluminum and aluminum alloys, or copper and its various alloys that are deposited on the surfaces of the first chip 24 and the second chip 22 by various metallization processes. Alternatively, the interconnections 25 and the castellations 26 may be comprised of gold, or various refractory metals, such as titanium, tungsten, tantalum, molybdenum, or some other conductive material. Still other means are available to form the interconnections. For example, wire bond elements may extend between the bond pads 23 on the first chip 24 and the bond pads 21 on the second chip 22 to electrically couple the first chip 24 to the second chip 22. The wire bond elements may be attached to the bond pads 21 and the bond pads 23 by spot welding, reflow soldering, or by depositing a conductive adhesive to the bond pads 21 and the bond pads 23 and immersing respective ends of the wire bond elements in the conductive adhesive.

Still referring to FIGS. 2 and 3, undesired electrical communication between the chips 22 and 24 is prevented through the application of various dielectric layers (not shown in FIGS. 2 and 3) that are interposed between the first chip 24 and the second chip 22 during the fabrication of the package 20. Additional dielectric layers (also not shown in FIGS. 2 and 3) are applied to the package 20 prior to the application of the interconnections 25 to electrically isolate the portions of the interconnections 25 extending between the bond pads 21 and 23. Similarly, the portions of the castellations 26 extending from the bond pads 23 to the lower surface 29 are electrically isolated from the chip 24 by an additional dielectric layer. Finally, a dielectric layer (also not shown in FIGS. 2 and 3) may be applied to the package 20 that substantially overlays the first chip 24 and the interconnections 25, leaving the castellations 26 at least partially exposed on the side 28. The various dielectric layers thus described will be discussed in greater detail below.

Figure 4A:
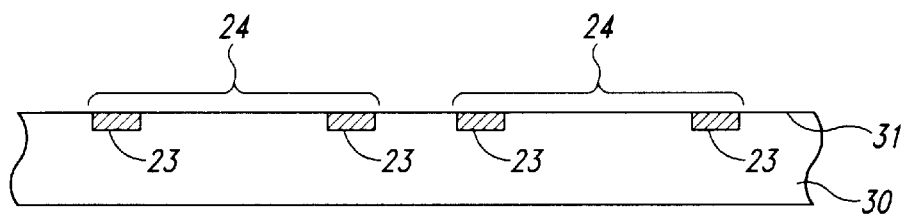
FIGS. 4(a) through 4(m) are partial cross sectional views of a vertically stacked, leadless semiconductor package that show the steps in a method of fabrication according to an embodiment of the invention.
Figure 4B:
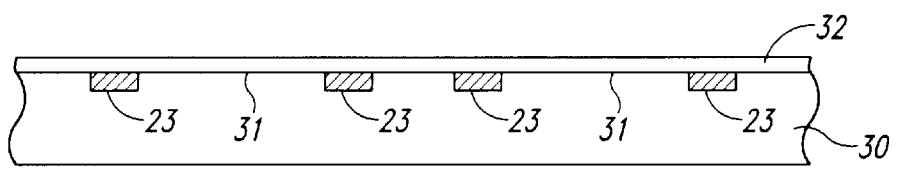
Figure 4C:
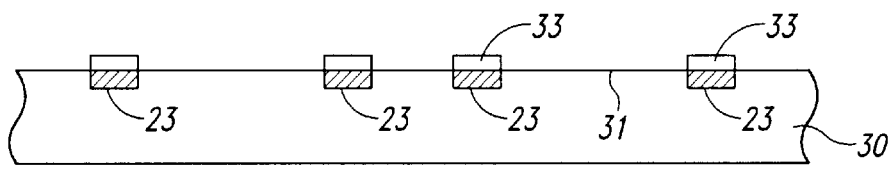

FIGS. 4(a) through 4(m) are partial cross-sectional views of the vertically stacked, interconnected and leadless semiconductor package 20 that show the steps in a method of fabricating the package 20 according to an embodiment of the invention. In FIG. 4(a), a wafer 30 that includes a plurality of first chips 24 formed therein is shown. As previously described above in connection with FIGS. 2 and 3, each of the first chips 24 has a plurality of bond pads 23 exposed at an upper surface 31 of the wafer 30 that comprise the input and output locations for each of the first chips 24. In FIG. 4(b), a photoresist layer 32 is applied to the wafer 30 of FIG. 4(a). The photoresist layer 32 may be uniformly applied to the upper surface 31 of the wafer 30 by suitable means, such as by spinning the wafer 30 after depositing a photoresist material to the upper surface 31. The photoresist layer 32 may then be baked to adhere the photoresist layer 32 to the upper surface 31, whereupon the layer 32 may then be exposed through a photomask (not shown) to obtain a predetermined photoresist pattern on the surface 31. The photoresist layer 32 is then washed to remove unaffected portions of the layer 32, to obtain photoresist elements 33 that overlay the bond pads 23, as shown in FIG. 4(c).

Figure 4D:
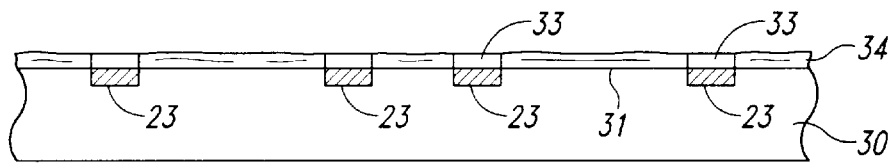

FIG. 4(d) shows an adhesive layer 34 applied to the upper surface 31 of the wafer 30 that extends between the photoresist elements 33. The adhesive layer 34 forms a dielectric layer and may be comprised, for example, of a dielectric adhesive that is suitable for the surface mounting of electronic components, such as CircuitSAF™ MA-420 surface mount adhesive, manufactured by the Lord Chemical Products Co. of Indianapolis, Ind., although other suitable alternatives exist. For example, the stacked semiconductor chips may be adhesively joined using an adhesive-backed bonding film, such as the LE surface bonding tape manufactured by the Lintec Corporation of Tokyo, Japan.

Figure 4E:
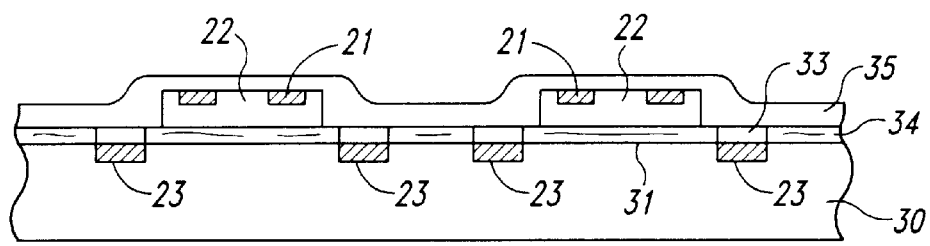
Figure 4F:
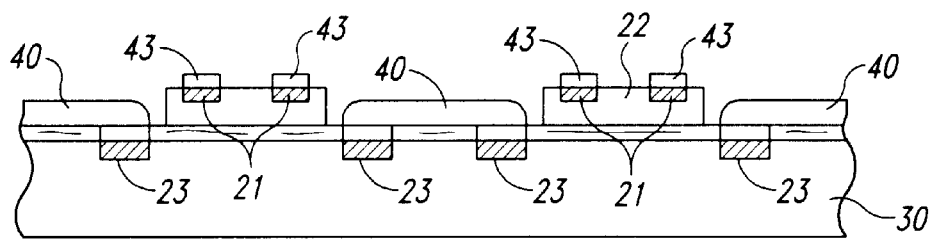

A plurality of second chips 22 are positioned on the upper surface 31 of the wafer 30 at locations between the bond pads 23 and retained on the surface 31 by the previously applied adhesive layer 34, as shown in FIG. 4(e). A photoresist layer 35 is then deposited on the upper surface 31 of the wafer 30 and upon the second chips 22. The photoresist layer 35 is subsequently exposed through a suitable photomask (not shown) and washed to remove the unaffected portions of the layer 35 to leave photoresist elements 40, which extend over the bond pads 23 of the wafer 30. The unaffected portions of the layer 35 also form photoresist elements 43 that overlay the bond pads 21 of the chips 22, as shown in FIG. 4(f).

Figure 4G:
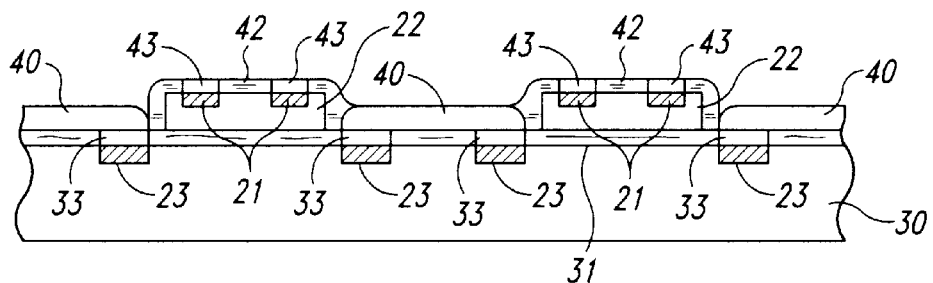

Referring now to FIG. 4(g), a first dielectric layer 42 is disposed on the second chips 22 that extends between the photoresist elements 43 on the bond pads 21, and further extends over the second chips 22 to abut the photoresist elements 40. The first dielectric layer 42 may be comprised of a non-electrically conductive epoxy material, or may be further comprised of a polyimide or benzocyclobutene material, although other alternatives exist.

Figure 4H:
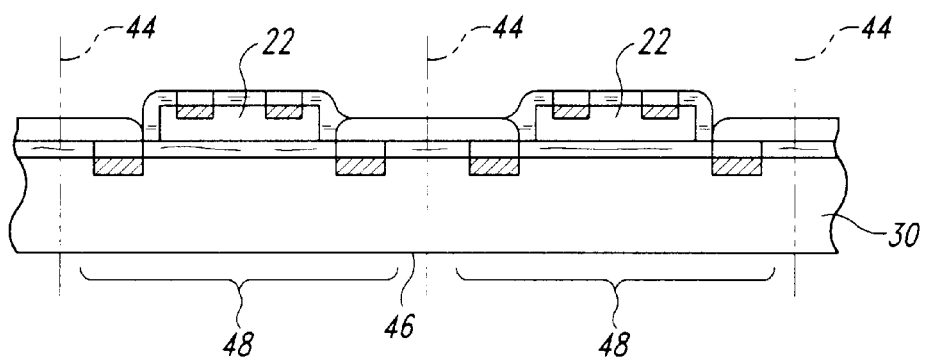

Turning now to FIG. 4(h), the wafer 30 may now be thinned by removing wafer material from a lower surface 46 of the wafer 30, in preparation for the wafer singulation, which will be described in greater detail below. The wafer 30 may be thinned, for example, by backgrinding the lower surface 46 of the wafer 30 to achieve a predetermined wafer thickness. Alternatively, the wafer 30 may be thinned by wet spin etching the lower surface 46, or by chemical-mechanical planarization of the lower surface 46, or by some other means. Still referring to FIG. 4(h), the wafer 30 is singulated along planes 44 to form a plurality of individual units 48, which include a single first chip 24 that underlies the second chip 22. The wafer singulation may be performed by various cutting methods, including shearing or punching the wafer 30 to form separated units 48, or by routing the wafer 30 to form the separated units 48 from the wafer 30. Alternatively, the wafer 30 may be diced by a rotating blade to form the separated units 48.

Figure 4I:
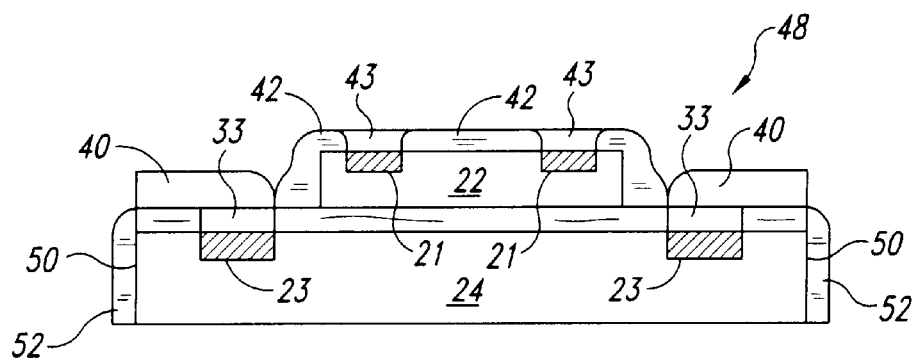
Figure 4J:
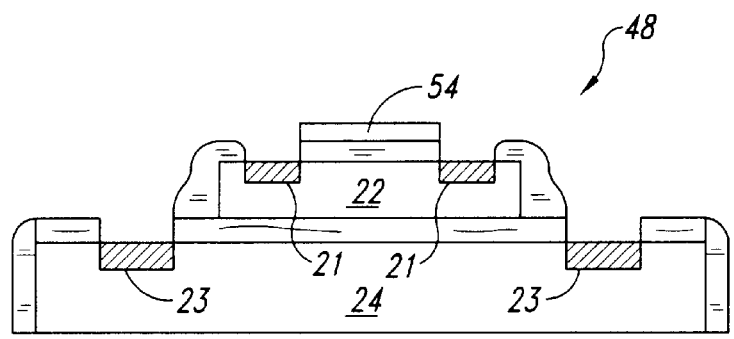

For clarity of illustration, FIGS. 4(i) through 4(m) show the remaining processing steps applied to the separated unit 48. Although these processing steps show subsequent operations applied to the unit 48, it is understood that at least a portion of the operations shown in FIGS. 4(i) through 4(m) may be applied prior to the singulation of the wafer 30 into separated units 48. Turning now to FIG. 4(i), a dielectric layer 52 is applied to opposing faces 50 of the unit 48. The dielectric layer 52 may be comprised of a non-electrically conductive epoxy material, or alternatively, for example, the dielectric layer 52 may be comprised of a polyimide or benzocyclobutene material. The photoresist elements 40, 43 and 33 may now be stripped to expose the bond pads 23 and the bond pads 21, as shown in FIG. 4(j). The photoresist elements 40, 43 and 33 may be stripped from the unit 48 using conventional photoresist stripping methods. For example, a wet chemical stripping process, or a dry plasma stripping process may be used.

Still referring to FIG. 4(j), a photoresist layer is deposited on the package 48 that is exposed through a suitable photomask (not shown) and washed to remove the unaffected areas to yield a photoresist element 54, which is positioned between the bond pads 21 of the second chip 22.

Figure 4K:
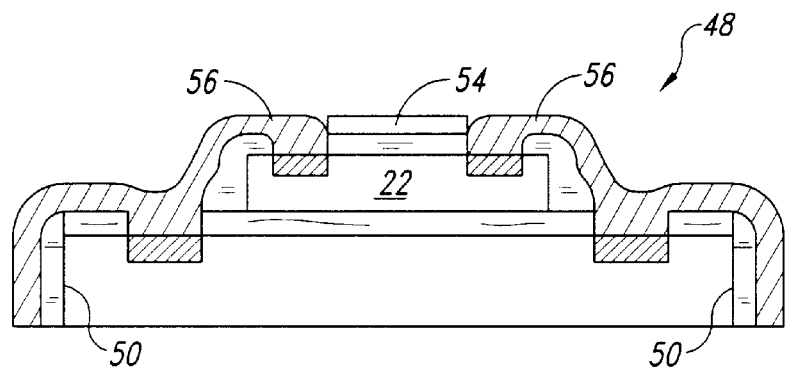
Figure 4L:
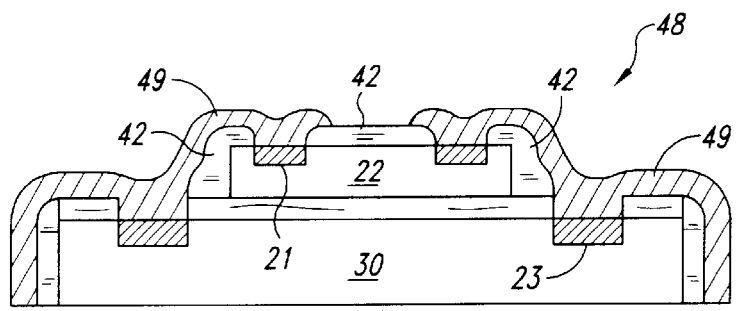
Figure 4M:
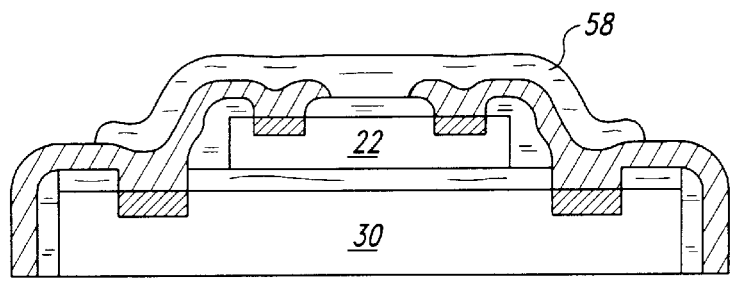

Turning now to FIG. 4(k), metallization layers 56 are applied to the package 48 to form conductive, interconnecting elements between the bond pads 23 on the first chip 24 and the bond pads 21 on the second chip 22. The metallization layers 56 also extend over the faces 50 to form a plurality of castellations. The metallization layer 54 may be comprised of aluminum, copper, or various alloys of these metals. Alternatively, gold, or various refractory metals may also be used. The metallization layer 56 may be applied to the package 48 using vacuum evaporation, sputter deposition, chemical vapor deposition (CVD) methods, or some other means.

FIG. 4(*l*) shows the package 48 after the photoresist element 54 has been stripped. A second dielectric layer 58 may then be applied to the package 48 that extends over the first chip 24 and the second chip 22 to at least partially encapsulate the package 48, as shown in FIG. 4(*m*). The second dielectric layer 58 may be comprised of a non-electrically conductive epoxy material, or may be comprised of polyimide or benzocyclobutene material, although other alternatives exist.

The foregoing embodiment allows a pair of stacked semiconductor chips to be interconnected by a plurality of metallization layers that extend from the bond pads on one semiconductor chip the bond pads on an adjacent semiconductor chip. The interconnections thus formed advantageously permit the semiconductor chips that comprise the stack to be coupled by relatively short interconnections, thus minimizing the introduction of parasitic capacitance and/or inductance and signal propagation delays. Further, bond integrity difficulties associated with different thermal coefficients of expansion between the chips comprising the packages are minimized by advantageously forming the interconnections on the exterior surfaces of the chips, rather than between abutting chip surfaces. Still other advantages are present in the foregoing embodiment. For example, the bond pad pitch may be increased beyond that generally achievable using wire bonding methods, or TAB. Further, the externally positioned interconnections and castellations permit the integrity of these connecting portions to be visually inspected subsequent to formation.

Figure 5:
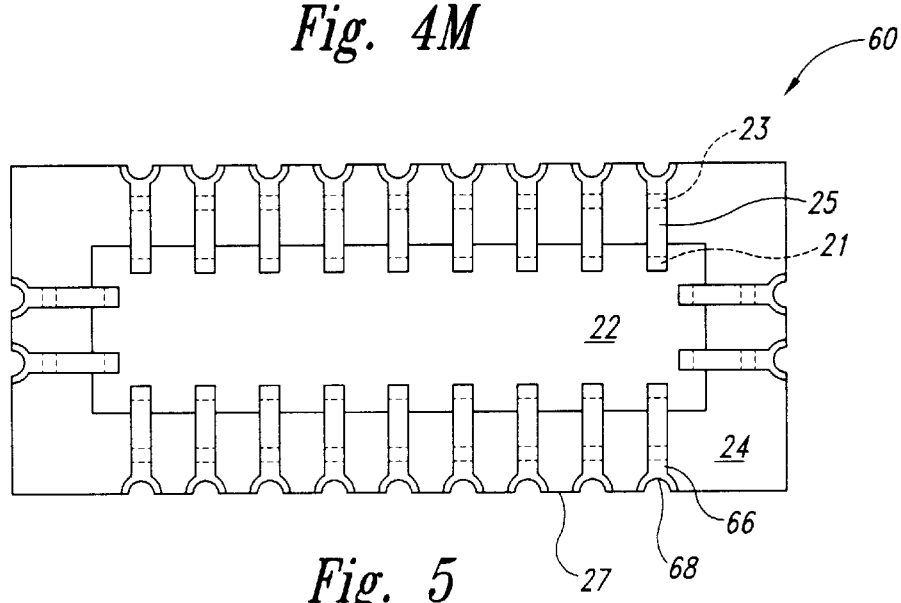
FIG. 5 is a plan view of a vertically stacked, leadless semiconductor package according to another embodiment of the invention.

FIG. 5 is a plan view of a vertically stacked, interconnected and leadless semiconductor package 60 according to another embodiment of the invention. As in the previous embodiment, a first chip 24 includes a plurality of bond pads 23 disposed on an active surface of the chip 24, which are positioned on a peripheral region of the chip 24. A second chip 22 similarly includes a plurality of bond pads 21 disposed on an active surface of the chip 22, which are positioned on a peripheral region of the chip 22. The second chip 22 is positioned on the first chip 24 to form a vertically stacked arrangement, with the electrical interconnections 25 extending from the bond pads 21 on the second chip 22 and across the peripheral region of second chip 22 and downwardly along a side of the second chip 22 to electrically couple with the bond pads 23 on the first chip 24. The package 20 includes a plurality of castellations 66 that are electrically coupled to the interconnections 25, which extend outwardly from the bond pads 23. The castellations 66 further include semi-cylindrical termination portions 68 that project inwardly into the edge 27 of the first chip 24.

Figure 6:
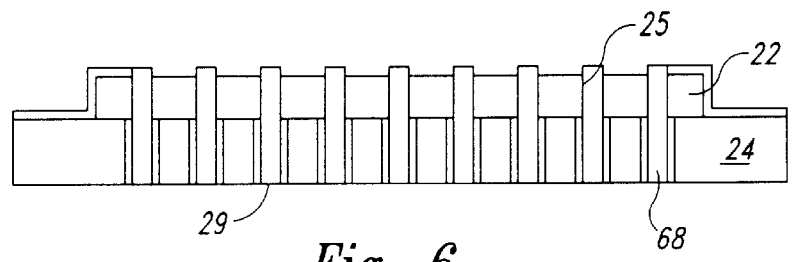
FIG. 6 is a side view of a vertically stacked, leadless semiconductor package according to another embodiment of the invention.

FIG. 6 is a side view of the semiconductor package 60, which shows the castellations 66 in greater detail. The castellations 66 extend downwardly from the interconnections 25 along a side 28 of the chip 24 to a lower surface 29 of the package 20. The castellations 66 form a plurality of leadless input/output locations for the package 60 that permit the package 60 to be electrically coupled to other external circuits or devices (not shown). As in the previous embodiment, the interconnections 25 and the castellations 66 may be comprised of various metals, including aluminum and aluminum alloys, or copper and its various alloys that are deposited on the surfaces of the first chip 24 and the second chip 22 by various metallization processes. Alternatively, the interconnections 25 and the castellations 66 may be comprised of gold, or various refractory metals, such as titanium, tungsten, tantalum or molybdenum.

FIGS. 7(*a*) through 7(*h*) are partial cross-sectional views of the vertically stacked, interconnected and leadless semiconductor package 60 that show the steps in a method of fabricating the package 60 according to an embodiment of the invention. Several of the steps in the method of fabricating the package 60 are similar to the steps illustrated in FIGS. 4(*a*) through 4(*g*), as discussed in connection with a previous embodiment. For brevity, these steps will not be discussed further in connection with the present embodiment.

FIG. 7(*a*) shows a partial, cross sectional view of a wafer 30 that includes a plurality of first chips 24 formed therein. The plurality of first chips 24 further includes a plurality of bond pads 23 exposed at an upper surface 31 of the wafer 30. The bond pads 23 are covered by photoresist elements 33 that are deposited by the photo-patterning process described earlier. An adhesive layer 34 is disposed on the upper surface 31 and retains a second chip 22 on the upper surface 31. The second chip 22 further includes a plurality of bond pads 21 that are similarly covered by photoresist elements 43. A first dielectric layer 42 is disposed on the second chip 22 that extends over the chip 22 to abut a photoresist element 40 disposed on a portion of the adhesive layer 34. An opening 70 projects through the wafer 30 along an axis 71 that is located approximately between the bond pads 23 of adjacent first chips 24, which may be of approximately circular cross sectional shape, although other cross sectional shapes may be used. The opening 70 may be formed by drilling the wafer 30 with a mechanical drilling device, or alternatively, the opening 70 may be formed by laser ablation, or by ion beam or reactive ion etching the opening 70.

FIG. 7(*b*) shows the wafer 30 subsequent to the application of a wafer thinning step. The wafer 30 may be thinned by backgrinding a lower surface 46 of the wafer 30, or alternatively, the wafer 30 may be thinned using the methods for wafer thinning described earlier. Following the wafer thinning step, the wafer 30 is singulated by cutting the wafer 30 along a plane 72 that extends through the axis 71 to form a plurality of individual units 72. The individual units 72 thus formed are comprised of a single first chip 24 bonded to a second chip 22. For clarity of illustration, the following description will address further processing steps as applied to the single unit 72, which is shown in FIGS. 7(*c*) through 7(*h*).

Subsequent to the singulation of the wafer 30 into individual units 72, a plurality of castellations 66 are formed along the edge 67 of each unit 72 that are approximately semicircular in cross sectional shape, as shown in FIG. 7(*c*), but more clearly shown with reference again to FIGS. 5 and 6. A dielectric layer 73 is next deposited on the inner surfaces of the castellations 66, as shown in FIG. 7(*d*). The photoresist elements 33, 40 and 43 are then stripped from the affected surfaces of the unit 72, and an additional photoresist element 54 is patterned on the unit 72, as shown in FIG. 7(*e*).

Figure 7A:
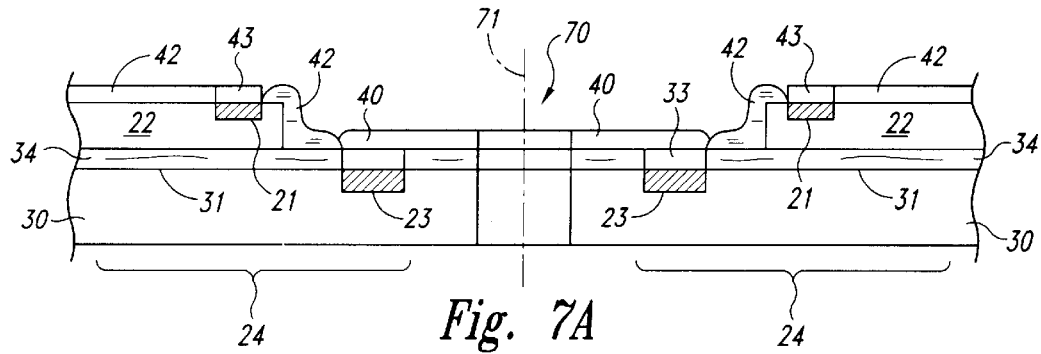
FIGS. 7(a) through 7(h) are partial cross sectional views of a vertically stacked, leadless semiconductor package that show the steps in a method of fabrication according to another embodiment of the invention.
Figure 7B:
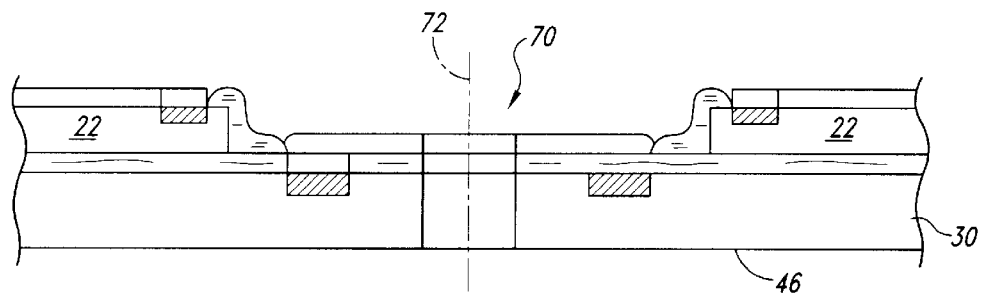
Figure 7C:
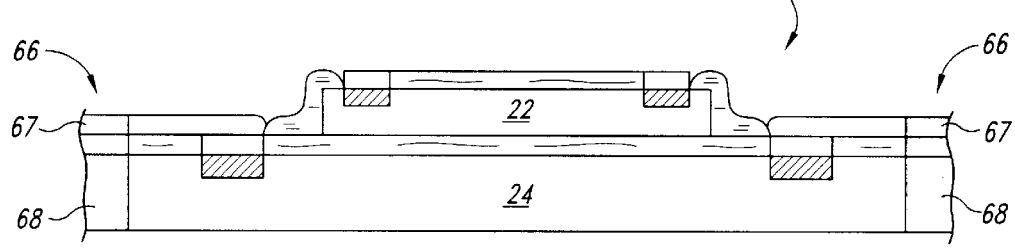
Figure 7D:
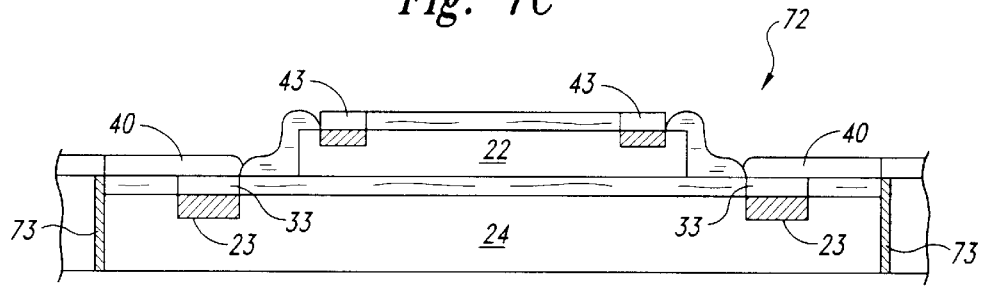
Figure 7E:
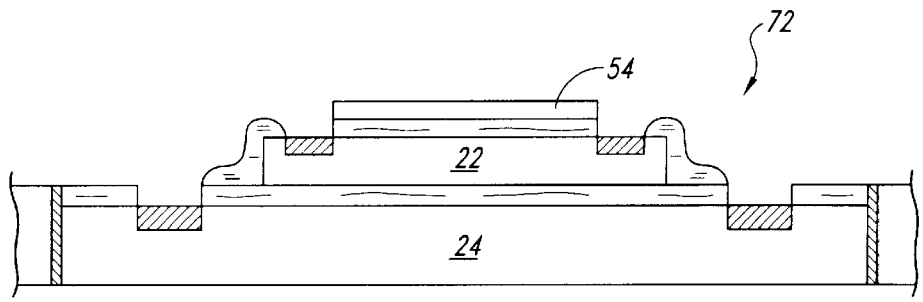
Figure 7F:
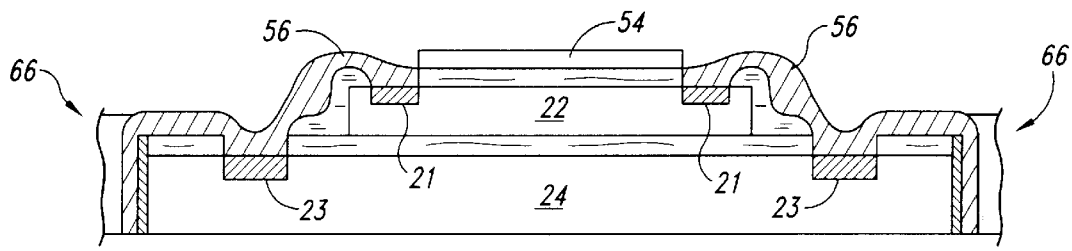
Figure 7G:
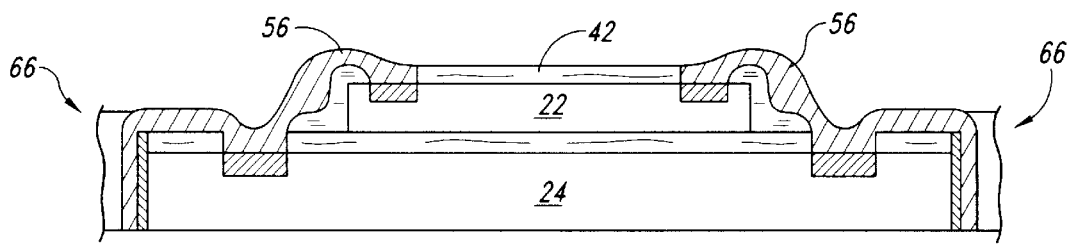
Figure 7H:
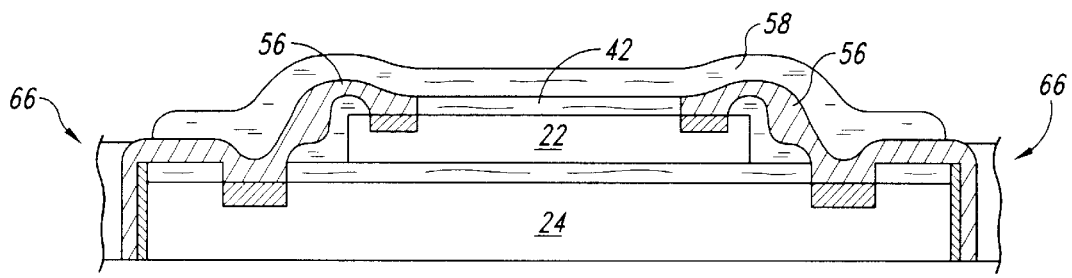

Turning now to FIG. 7(*f*), metallization layers 56 are deposited on the unit 72 that extend from the bond pads 21 on the second chip 22 to the bond pads 23 on the first chip 24, and downwardly into the castellations 66, as shown in FIG. 7(g). A second dielectric layer 58 may then be applied to the unit 72 that extends over the second chip 22 and covers at least a portion of the metallization layers 56, as shown in FIG. 7(h).

In addition to the advantages described in connection with the previous embodiment, the foregoing embodiment advantageously permits the package 60 to be positioned on an underlying substrate having a plurality of upwardly projecting conductive members that may be received by the semicircular castellations of the package 60. As a result, improved electrical and mechanical connections between the package 60 and the underlying substrate may be obtained.

Figure 8:
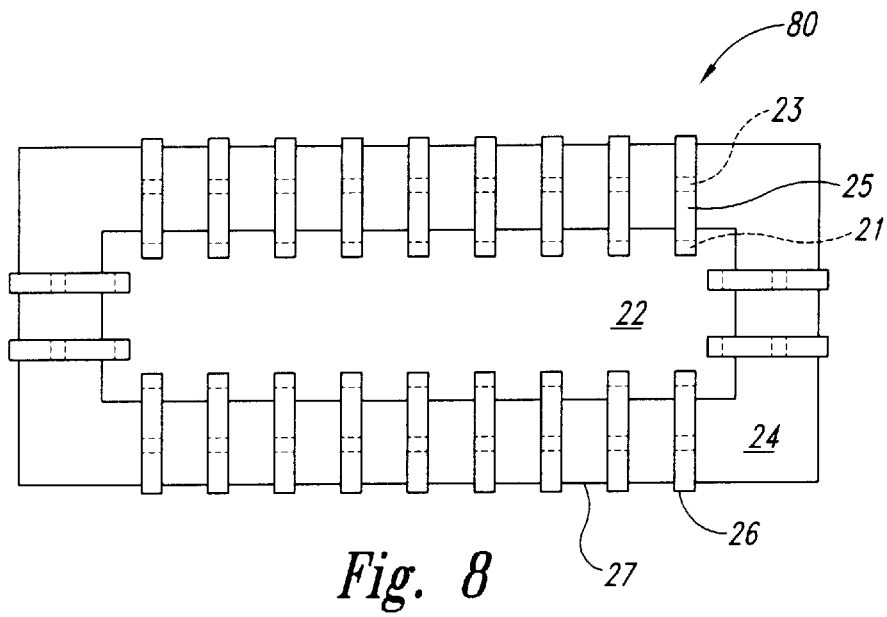
FIG. 8 is a plan view of a vertically stacked, leadless semiconductor package according to still another embodiment of the invention.

FIG. 8 is a plan view of a vertically stacked, interconnected and leadless semiconductor package 80 according to still another embodiment of the invention. As in the previous embodiments, a first chip 24 includes a plurality of bond pads 23 disposed on an active surface of the chip 24. A second chip 22 includes a plurality of bond pads 21 disposed on an active surface of the chip 24. The second chip 22 is positioned on the first chip 24 to form a vertically stacked arrangement, with electrical interconnections 25 extending between the bond pads 23 on the first chip 24 and the bond pads 21 on the second chip 22. The package 80 includes a plurality of castellations 26 that are electrically coupled to the interconnections 25, which extend outwardly from the bond pads 23.

Figure 9:
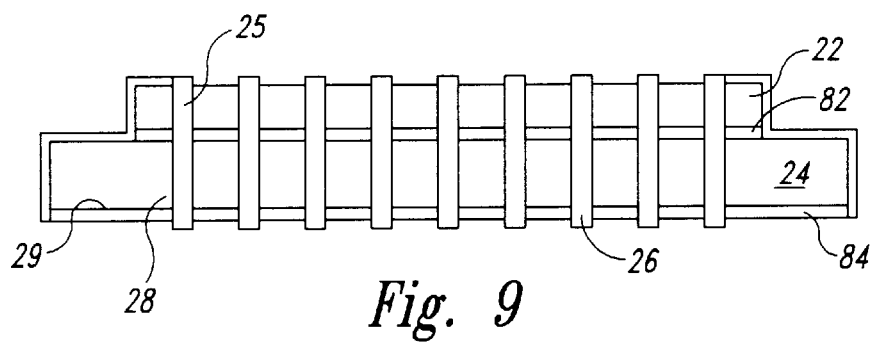
FIG. 9 is a side view of a vertically stacked, leadless semiconductor package according to still another embodiment of the invention.

Referring now to FIG. 9, a side view of the semiconductor package 80 is shown. The castellations 26 are electrically coupled to the interconnections 25 and extend downwardly from the interconnections 25 along a side 28 of the chip 24 to a lower surface 29 of the package 80. A first insulator 82 is positioned between the first chip 22 and the second chip 24 to prevent electrical communication between the first chip 24 and the second chip 22. A second insulator 84 is positioned on the lower surface 29 of the first chip 24 to prevent electrical communication between the first chip 24 and an underlying substrate (not shown) that supports the package 80. The first insulator 82 and the second insulator 84 may be comprised of a dielectric polymer, or a glass substrate that is attached to the first chip 24 and the second chip 22, although other insulating materials may be used. For example, the first insulator 82 and the second insulator 84 may be comprised of a silicon dioxide layer formed on the first chip 24 and the second chip 22 by thermal oxidation. Alternatively, the first insulator 82 and the second insulator 84 may be comprised of a variety of spin-on-glass compounds, such as ACCUGLASS, which is manufactured by Honeywell, Inc. of Minneapolis, Minn.

Figure 10A:
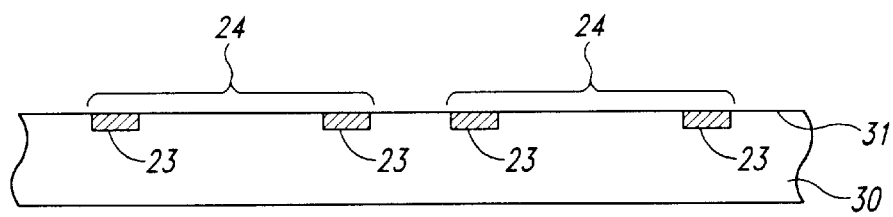
FIGS. 10(a) through 10(i) are partial cross sectional views of a vertically stacked, leadless semiconductor package that show the steps in a method of fabrication according to still another embodiment of the invention.
Figure 10B:
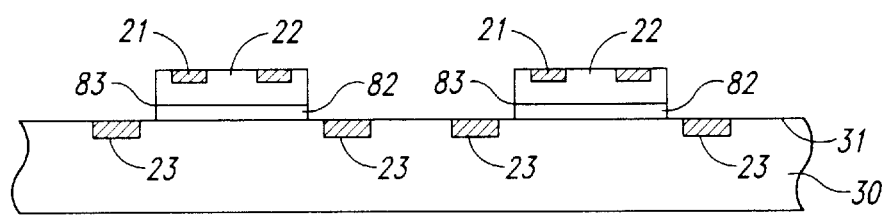

FIGS. 10(a) through 10(i) are partial cross-sectional views of the vertically stacked, interconnected and leadless semiconductor package 80 that show the steps in a method of fabricating the package 80 according to still another embodiment of the invention. In FIG. 10(a), a plurality of first chips 24 are formed in a wafer 30, with each of the first chips 24 having a plurality of bond pads 23 that are exposed at an upper surface 31 of the wafer 30. In FIG. 10(b), a plurality of first chips 22 having first insulators 82 disposed on a lower surface 83 of the first chips 22 are positioned on the upper surface 31 of the wafer 30. The first insulators 82 may be adhesively joined to the upper surface 31 by a dielectric adhesive, such as a polyimide adhesive, or benzocyclobutene.

Figure 10C:
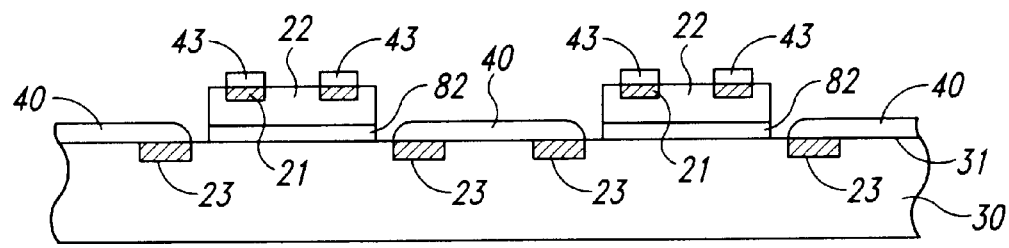
Figure 10D:
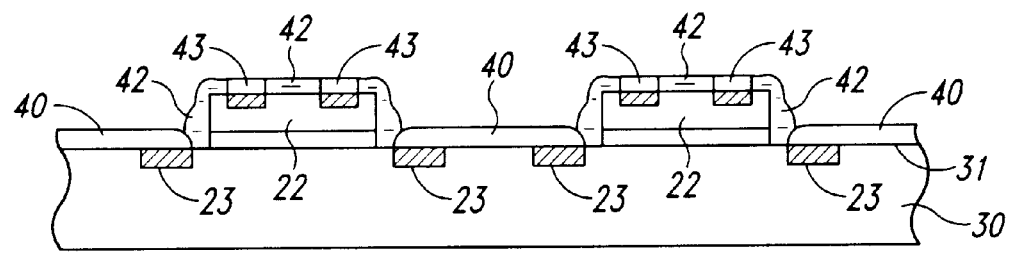

In FIG. 10(c), photoresist elements 40 are formed on the upper surface 31 that overlay and extend between the bond pads 23. Similarly, photoresist elements 43 are formed that overlay the bond pads 43 on the first chips 22. The photoresist elements 40 and 43 are formed from photoresist materials that are applied to the surfaces and patterned by exposure of the photoresist material through a photomask, as described earlier. A first dielectric layer 42 is disposed on the first chips 22 between the photoresist elements 43 and extends over the first chips 22 to abut the photoresist elements 40, as shown in FIG. 10(d).

Figure 10E:
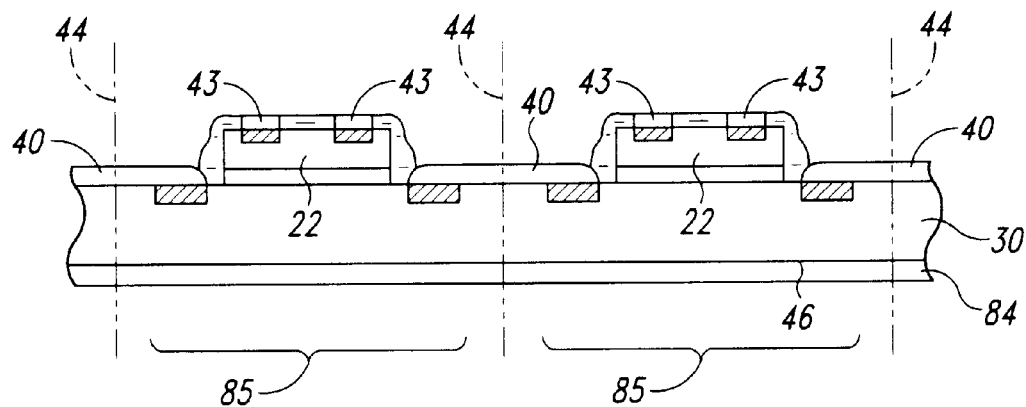
Figure 10F:
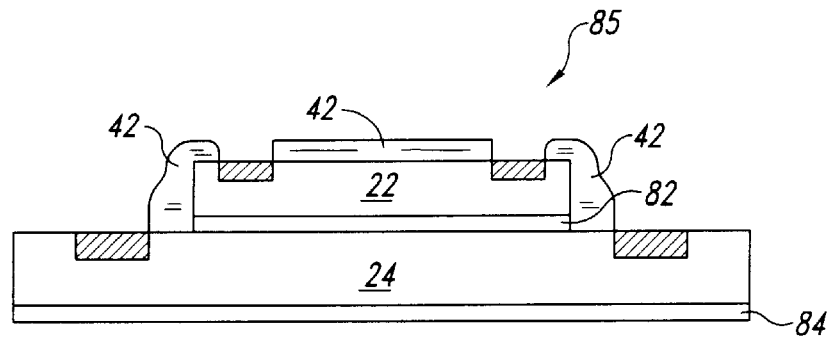

In FIG. 10(e), the wafer 30 is thinned by removing material from the lower surface 46 of the wafer 30 by any of the wafer thinning methods previously described. A second insulator 84 may now be applied to the lower surface 46 of the thinned wafer 30. The wafer 30 may then be singulated to form the individual units 85. The photoresist elements 40 and 43 are then stripped from the singulated unit 85, as shown in FIG. 10(f). For clarity of illustration, FIGS. 10(f) through 10(i) show the remaining processing steps applied to the individual unit 85. Although these processing steps show subsequent operations applied to the unit 85, it is understood that at least a portion of the operations shown in FIGS. 10(f) through 10(i) may be applied prior to the singulation of the wafer 30 into the units 85.

Figure 10G:
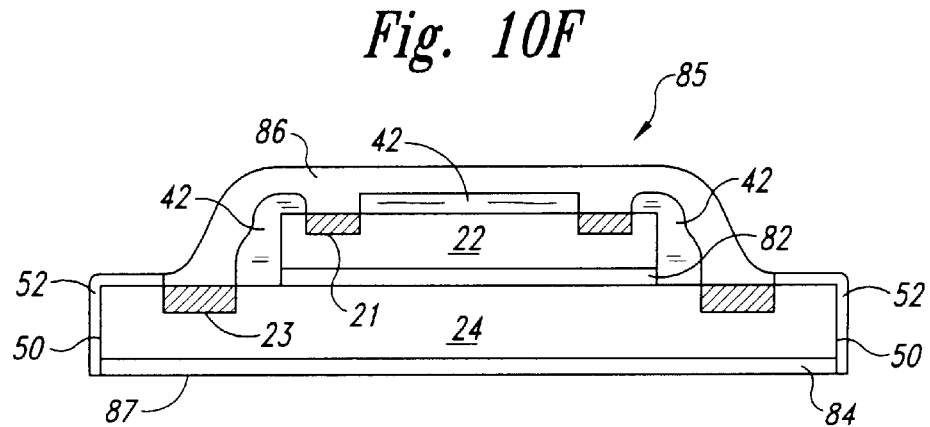
Figure 10H:
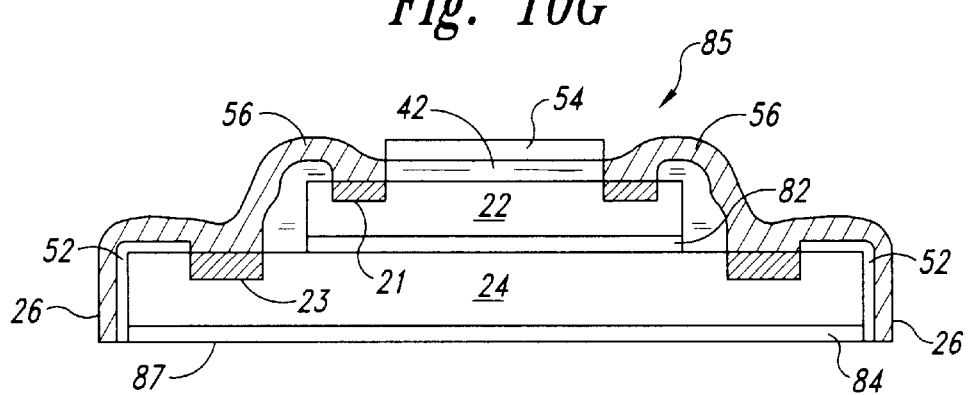
Figure 10I:
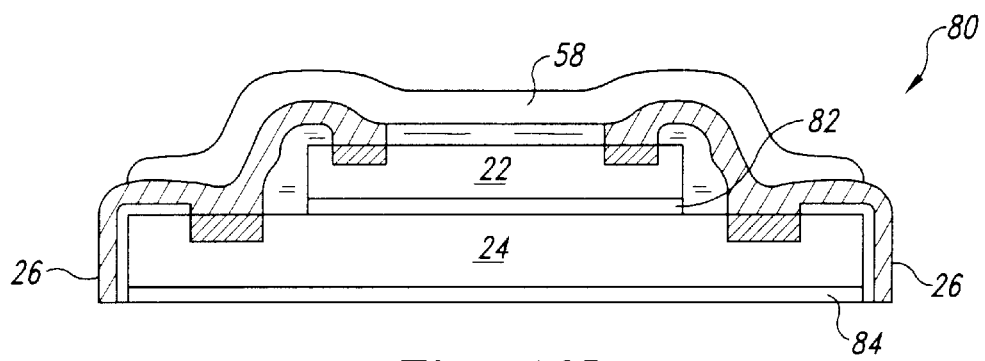

Turning now to FIG. 10(g), a layer of photoresist 86 is applied to the unit 85 that is patterned to leave opposing ends 50 of the unit 85 exposed. A dielectric layer 52 may then be deposited on the ends 50 that extends from the bond pads 23 downwardly to a lower surface 87 of the second insulator 84. The photoresist layer 86 may then be stripped, and metallization layers 56 applied to the unit 85 that extend from the bond pads 21 on the first chip 22 to the bond pads 23 on the second chip 24 and downwardly over the dielectric layers 52 to the lower surface 87 of the second insulator 84 to form a plurality of castellations 26. A photoresist element 54 has been formed at this step to prevent the metallization layers 56 from extending across the first dielectric layer 42. The photoresist element 54 may subsequently be stripped from the unit 85, and a second dielectric layer 58 may be applied over the first chip 22 and the second chip 24 to leave the plurality of castellations 26 exposed, as shown in FIG. 10(i).

The inclusion of insulating layers as described in the present embodiment advantageously permits semiconductor chips that have an active rear face that opposes the active front face upon which the bond pads are disposed to be assembled into a vertical stack without the forming undesired electrical conduction paths between the chips comprising the stack, or between the package and other extended portions of an electronic system.

Figure 11:
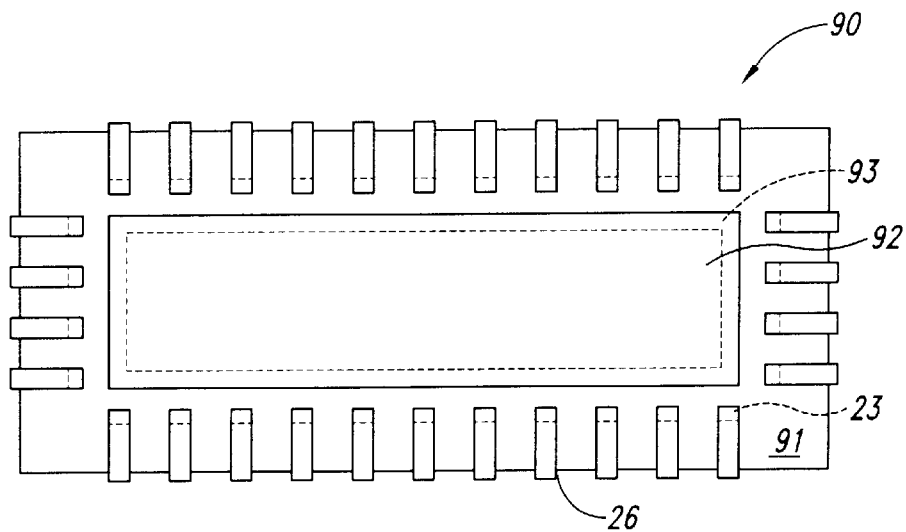
FIG. 11 is a plan view of a vertically stacked, leadless semiconductor package according to yet another embodiment of the invention.

FIG. 11 is a plan view of a leadless semiconductor package 90 according to yet another embodiment of the invention. In contrast to the previous embodiments, the semiconductor chip 91 has a photosensitive device 92 formed therein, which may include any device that senses incident light by the photoelectric effect. For example, the photosensitive device 92 may be comprised of a charge coupled device (CCD) array, which is further comprised of a plurality of individual elements, each capable of accumulating the electrons produced by the incident photons within a non-conductive boundary while the element is exposed to the incident light, and releasing the accumulated electrons after the exposure is interrupted. Alternatively, the photosensitive device 92 may be comprised of a complementary metal oxide semiconductor (CMOS) imaging device. The photosensitive device 92 may be overlaid by one or more optical layers 93, which may be comprised, for example of layers generally having a low index of refraction that are transparent to visible light, or layers that block certain portions of the visible spectrum, such as red, green and blue optical filters that may be used to form a color image from the CCD elements previously described. Still further, the optical layers 93 may be used to block the infrared, or ultraviolet portions of the electromagnetic spectrum. Still referring to FIG. 11, the chip 91 includes a plurality of bond pads 23 that are coupled to the active elements in the chip 91, and comprise the input and output locations for the chip 91. The bond pads 23 are electrically coupled to a plurality of castellations 26 that extend from the bond pads 23 to an edge 27 of the chip 91.

Figure 12:
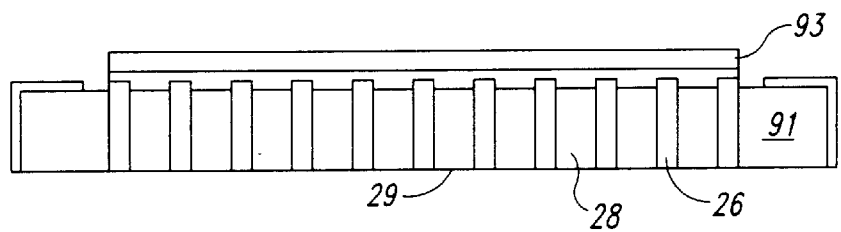
FIG. 12 is a side view of a vertically stacked, leadless semiconductor package according to yet another embodiment of the invention.

Referring now to FIG. 12, a side view of the semiconductor package 90 is shown. The castellations 26 extend downwardly from the bond pads 23 along a side 28 of the chip 91 to a lower surface 29 of the package 90. As in the embodiments previously described, the castellations 26 permit the package 90 to be electrically coupled to other circuits and/or devices (not shown).

Figure 13A:
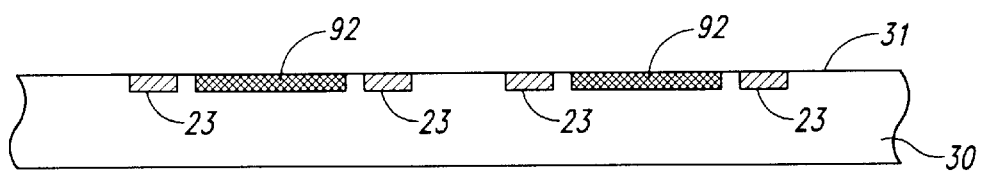
FIGS. 13(a) through 13(f) are partial cross sectional views of a vertically stacked, leadless semiconductor package that show the steps in a method of fabrication according to yet another embodiment of the invention.
Figure 13B:
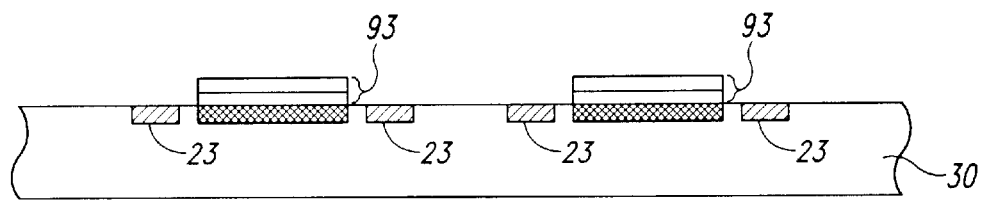

FIGS. 13(a) through 13(f) are partial cross-sectional views of the leadless semiconductor package 90 that show the steps in a method of fabricating the package 90 according to an embodiment of the invention. FIG. 13(a) shows a wafer 30 that includes a plurality of photosensitive devices 92 formed therein. Each of the devices 92 has a plurality of adjacent bond pads 23 that are exposed at an upper surface 31 of the wafer 30 that comprise the input and output locations for each of the photosensitive devices 92. In FIG. 13(b), an optical layer 93 is disposed on each of the photosensitive devices 92. The optical layer 93 may include one or more layers of an appropriately sized optically transparent material that are positioned over each of the photosensitive devices 92, and retained on the photosensitive device 92 with an optically transparent adhesive. Alternatively, the optical layer 93 may be formed by spin coating one or more layers of an optically transparent material onto the surfaces of the photosensitive devices 93, or by sputtering an optically transparent material onto the surfaces of the devices 93. Further, the optical layer 93 may be also be formed by growing an epitaxial layer of a semiconductor material onto the surfaces of the devices 93.

Figure 13C:
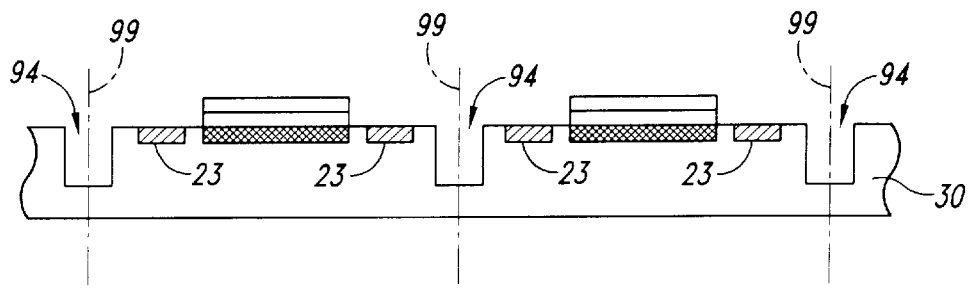
Figure 13D:
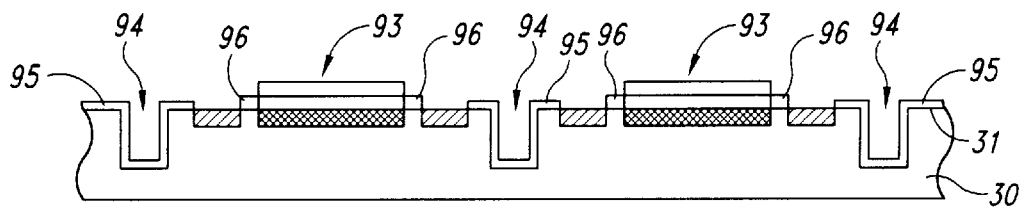

Turning now to FIG. 13(c), a plurality of drains 94 are cut into the wafer 30 along planes 99, which are located between the bond pads 23 of adjacent devices 93. The drains 94 project into the wafer 30 to a depth of at least about one-half thickness of the wafer 30. Dielectric layers 95 are then deposited in the drains 94 that extend downwardly into the drains 94 and over a portion of the upper surface 31 to abut the bond pads 23. A dielectric layer 96 is similarly deposited on the upper surface 31 that abuts the optical layers 93 and the bond pads 23, as shown in FIG. 13(d).

Figure 13E:
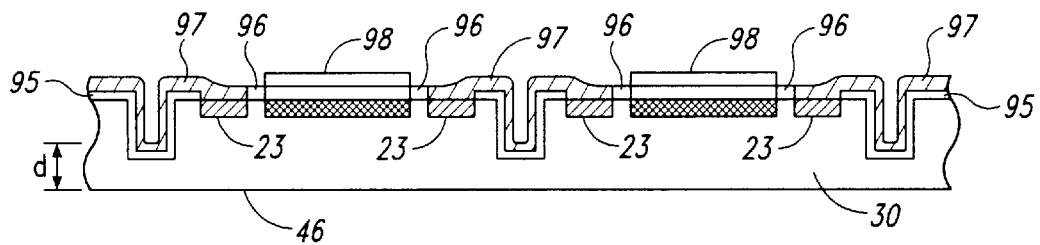
Figure 13F:
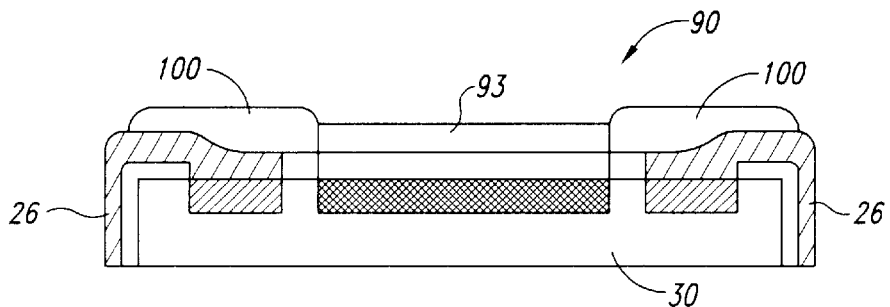

Referring to FIG. 13(e), metallization layers 97 are deposited over the dielectric layers 95 that further extend over the bond pads 23 and abut the dielectric layers 96. The upper surfaces 98 of the optical layers 93 may now be optionally subjected to a surface planarization to obtain a uniformly flat optical surface, and to further thin the layers 93. The wafer 30 may now be thinned by backgrinding the wafer 30 to remove material from a lower surface 46 of the wafer 30. The backgrinding proceeds through the lower surface 46 and towards the upper surface 31 to a distance "d" so that the wafer 30 is singulated into separate packages 90, as shown in FIG. 13(f). Alternatively, other wafer singulation methods may be used to singulate the wafer 30 into the separate packages 90. Still referring to FIG. 13(f), a dielectric layer 100 that abuts the optical layers 93 is deposited over the castellations 26.

In addition to the advantages previously discussed in connection with other embodiments of the disclosed invention, the foregoing embodiment allows a photosensitive semiconductor package to be formed with reduced size, which advantageously has a reduced cross sectional thickness.

The above description of illustrated embodiments of the invention is not intended to be exhaustive or to limit the invention to the precise form disclosed. While specific embodiments of, and examples of, the invention are described in the foregoing for illustrative purposes, various equivalent modifications are possible within the scope of the invention as those skilled within the relevant art will recognize. For example, although a package having two semiconductor chips vertically stacked and interconnected is disclosed, it is understood that three or more semiconductor chips may be combined and interconnected in the manner described. Further, although the interconnections and the castellations are described as separate elements, it is understood that the castellations and the interconnections are disposed on the chips as a continuous segment of conductive material. Moreover, the various embodiments described above can be combined to provide further embodiments. Accordingly, the invention is not limited by the disclosure, but instead the scope of the invention is to be determined entirely by the following claims.

What is claimed is:

1. A semiconductor package, comprising:
   a first semiconductor chip having an upper surface;
   a second semiconductor chip having an upper surface and an opposing lower surface, the lower surface of the second chip being positioned on the upper surface of the first chip to define an exposed portion of the upper surface of the first chip, the first chip further including a first plurality of bond pads disposed on the exposed portion, and the second chip further including a second plurality of bond pads disposed on the upper surface of the second chip;
   a plurality of interconnections that extend from the first plurality of bond pads to the second plurality of bond pads, the interconnections being disposed on selected portions of the first and second chips to electrically couple the first and second chips; and
   a plurality of castellations disposed on selected portions of the first chip that extend outwardly from the first plurality of bond pads to form leadless input/output locations for the package.

2. The semiconductor package according to claim 1 wherein the second semiconductor chip is further comprised of a peripheral surface that extends between the upper and the lower surface, and further wherein the plurality of interconnections disposed on selected portions of the first and second chips extend inwardly along the upper surface of the first chip from the first plurality of bond pads and extend upwardly along the peripheral surface to the second plurality of bond pads.

3. The semiconductor package according to claim 1 wherein the first semiconductor chip is further comprised of a lower surface having a lower edge, the lower surface opposing the upper surface and having a peripheral surface that extends between the upper and the lower surfaces.

4. The semiconductor package according to claim 3 wherein the plurality of castellations is further comprised of a plurality of planar members that extend upwardly from the lower edge and along the peripheral surface to the first plurality of bond pads.

5. The semiconductor package according to claim 3 wherein the plurality of castellations is further comprised of a plurality of semi-circular members each having an axis that is approximately parallel to the peripheral surface that extend inwardly into the peripheral surface and upwardly from the lower edge to the first plurality of bond pads.

6. The semiconductor package of claim 1, further comprising a dielectric layer interposed between the plurality of interconnections and the first and second chips.

7. The semiconductor package of claim 1, further comprising a dielectric layer interposed between the plurality of castellations and the first chip.

8. The semiconductor package of claim 1, further comprising a dielectric layer disposed on the second chip that substantially encapsulates the second chip and extends onto at least a portion of the first chip.

9. The semiconductor package according to claim 3, further comprising a n insulating layer disposed on the lower surface of the first chip.

10. The semiconductor package according to claim 9, wherein the insulating layer is comprised of a dielectric polymer.

11. The semiconductor package according to claim 9, wherein the insulating layer is comprised of a glass substrate.

12. The semiconductor package of claim 1, further comprising an insulating layer interposed between the first and second chips.

13. The semiconductor package according to claim 12, wherein the insulating layer is further comprised of a dielectric adhesive.

14. The semiconductor package according to claim 12, wherein the insulating layer is further comprised of a dielectric polymer adhesively joined to the upper surface of the first chip and the lower surface of the second chip.

15. The semiconductor package according to claim 12, wherein the insulating layer is further comprised of a glass substrate adhesively joined to the upper surface of the first chip and the lower surface of the second chip.

16. The semiconductor package according to claim 12, wherein the insulating layer is further comprised of a self-adhering dielectric film.

17. The semiconductor package according to claim 1 wherein the plurality of interconnections are further comprised of a plurality of metallic films.

18. The semiconductor package according to claim 17 wherein the plurality of metallic films are comprised of aluminum.

19. The semiconductor package according to claim 17 wherein the plurality of metallic films are comprised of copper.

20. The semiconductor package according to claim 17 wherein the plurality of metallic films are comprised of a refractory metal.

21. The semiconductor package according to claim 1 wherein the plurality of interconnections further comprises a plurality of bonding wires that extend from the first plurality of bond pads to the second plurality of bond pads.

22. The semiconductor package according to claim 1 wherein the plurality of castellations are further comprised of a plurality of metallized films.

23. The semiconductor package according to claim 22 wherein the plurality of metallic films are comprised of aluminum.

24. The semiconductor package according to claim 22 wherein the plurality of metallic films are comprised of copper.

25. The semiconductor package according to claim 22 wherein the plurality of metallic films are comprised of a refractory metal.

26. A semiconductor package, comprising:
   a first semiconductor chip having an upper surface;
   a second semiconductor chip having an upper surface and an opposing lower surface, the lower surface of the second chip being positioned on the upper surface of the first chip to define an exposed portion of the upper surface of the first chip, the first chip further including a first plurality of bond pads disposed on the exposed portion, and the second chip further including a second plurality of bond pads disposed on the upper surface of the second chip;
   a plurality of wire bond elements that extend from the first plurality of bond pads to the second plurality of bond pads to electrically couple the first and second chips; and
   a plurality of castellations disposed on selected portions of the first chip that extend outwardly from the first plurality of bond pads to form leadless input/output locations for the package.

27. The semiconductor package according to claim 26 wherein the first semiconductor chip is further comprised of a lower surface having a lower edge, the lower surface opposing the upper surface and having a peripheral surface that extends between the upper and the lower surfaces.

28. The semiconductor package according to claim 27 wherein the plurality of castellations is further comprised of a plurality of planar members that extend upwardly from the lower edge and along the peripheral surface to the first plurality of bond pads.

29. The semiconductor package according to claim 27 wherein the plurality of castellations is further comprised of a plurality of semi-circular members each having an axis that is approximately parallel to the peripheral surface that extend inwardly into the peripheral surface and upwardly from the lower edge to the first plurality of bond pads.

30. The semiconductor package of claim 26, further comprising a dielectric layer interposed between the plurality of castellations and the first chip.

31. The semiconductor package of claim 26, further comprising a dielectric layer disposed on the second chip that substantially encapsulates the second chip and extends onto at least a portion of the first chip.

32. The semiconductor package according to claim 27, further comprising an insulating layer disposed on the lower surface of the first chip.

33. The semiconductor package according to claim 32, wherein the insulating layer is comprised of a dielectric polymer.

34. The semiconductor package according to claim 32, wherein the insulating layer is comprised of a glass substrate.

35. The semiconductor package of claim 26, further comprising an insulating layer interposed between the first and second chips.

36. The semiconductor package according to claim 35, wherein the insulating layer is further comprised of a dielectric adhesive.

37. The semiconductor package according to claim 35, wherein the insulating layer is further comprised of a dielectric polymer adhesively joined to the upper surface of the first chip and the lower surface of the second chip.

38. The semiconductor package according to claim 35, wherein the insulating layer is further comprised of a glass substrate adhesively joined to the upper surface of the first chip and the lower surface of the second chip.

39. The semiconductor package according to claim 35, wherein the insulating layer is further comprised of a self-adhering dielectric film.

40. The semiconductor package according to claim 26 wherein the plurality of castellations are further comprised of a plurality of metallized films.

41. The semiconductor package according to claim 40 wherein the plurality of metallic films are comprised of aluminum.

42. The semiconductor package according to claim 40 wherein the plurality of metallic films are comprised of copper.

43. The semiconductor package according to claim 40 wherein the plurality of metallic films are comprised of a refractory metal.

* * * * *

UNITED STATES PATENT AND TRADEMARK OFFICE
CERTIFICATE OF CORRECTION

PATENT NO. : 6,747,348 B2
DATED : June 8, 2004
INVENTOR(S) : Boon Suan Jeung, Chia Yong Poo and Low Siu Waf It is certified that error appears in the above-identified patent and that said Letters Patent is hereby corrected as shown below:

<u>Title page,</u>
Item [54], References Cited, U.S PATENT DOCUMENTS, insert the following:

| | | | |
|---|---|---|---|
| -- 4,794,092 | 12/1988 | Solomon | 437/51 |
| 5,808,872 | 9/1998 | Ozawa | 361/760 |
| 5,892,287 | 4/1999 | Hoffman et al. | 257/777 |
| 6,232,655 B1 | 5/2001 | Sugimura | 257/690 |
| 6,344,234 | 5/2002 | Dalal et al. | 427/96 |
| 6,380,629 B1 | 4/2002 | Kim | 257/777 |
| 6,396,975 | 5/2002 | Wood et al. | 385/18 |
| 2001/0009300 A1 | 7/2001 | Sugimura | 257/693 |
| 2002/0153615 A1 | 10/2002 | Komiyama | 257/777 --. |

OTHER PUBLICATIONS,
"Lau, John H and Shi Wei Ricky Lee," should read -- Lau, John H. and Shi Wei Ricky Lee, --.

<u>Column 2,</u>
Lines 49-50, "without the use of a discrete interconnecting elements," should read -- without the use of discrete interconnecting elements, --.

<u>Column 7,</u>
Line 23, "chip the bond pads" should read -- chip to the bond pads --.

<u>Column 10,</u>
Line 44, "without the forming" should read -- without forming --.
Line 64, "comprised, for example of" should read -- comprised, for example, of --.

<u>Column 11,</u>
Line 3, "the infrared, or" should read -- the infrared or --.

UNITED STATES PATENT AND TRADEMARK OFFICE
CERTIFICATE OF CORRECTION

PATENT NO.    : 6,747,348 B2
DATED         : June 8, 2004
INVENTOR(S)   : Boon Suan Jeung, Chia Yong Poo and Low Siu Waf It is certified that error appears in the above-identified patent and that said Letters Patent is hereby corrected as shown below:

Column 13,
Line 6, "comprising a n insulating" should read -- comprising an insulating --.

Signed and Sealed this

Thirtieth Day of May, 2006

JON W. DUDAS
*Director of the United States Patent and Trademark Office*